United States Patent
Lai et al.

[11] Patent Number: 6,149,050
[45] Date of Patent: Nov. 21, 2000

[54] METHOD FOR ATTACHING SOLDERABLE WIRE LEADS TO A LEAD FRAME

[75] Inventors: Kwok Fai Lai; Siu-wai Wan; Siu-keung Tse; Jack Xiong Zhenpeng, all of Kowloon, The Hong Kong Special Administrative Region of the People's Republic of China

[73] Assignee: Bel Fuse, Inc., Jersey City, N.J.

[21] Appl. No.: 09/238,229

[22] Filed: Jan. 27, 1999

Related U.S. Application Data

[60] Provisional application No. 60/073,059, Jan. 29, 1998.
[51] Int. Cl.[7] .......................... B23K 31/02; B23K 31/00; B23K 1/00; B23K 5/00
[52] U.S. Cl. .................................... 228/180.1; 228/180.5; 228/6.1
[58] Field of Search ............................. 228/180.1, 180.5, 228/6.1

[56] References Cited

U.S. PATENT DOCUMENTS

| | | | |
|---|---|---|---|
| 3,873,890 | 3/1975 | Beckman et al. | 317/101 CC |
| 4,127,934 | 12/1978 | Bartley et al. | 29/626 |
| 4,187,529 | 2/1980 | Bartley et al. | 361/404 |
| 4,641,112 | 2/1987 | Kohayakawa | 333/140 |
| 5,015,981 | 5/1991 | Lint et al. | 336/65 |
| 5,521,124 | 5/1996 | Tai | 437/209 |

*Primary Examiner*—Patrick Ryan
*Assistant Examiner*—Zidia T. Pittman
*Attorney, Agent, or Firm*—Ostrolenk, Faber, Gerb & Soffen, LLP

[57] ABSTRACT

A method and apparatus for soldering wires of components on PC boards to a lead frame. Wires from the electronic components on a PC board supported by a fixture are led through respective pathways and particularly plated grooves on each side of the PC board. The wires within the pathways are held there by being adhered to a temporary fixture beneath the board until the wires are later affixed in their grooves by dipping the sides of the PC board in a solder pool. The excess wire tails are cut away. The PC board is then mounted on a lead frame, and the leads of the lead frame are aligned with respective pathways of the PC board. The PC board and lead frame are then dipped in solder which electrically connects the wires in their respective pathways to the leads of the lead frame.

12 Claims, 5 Drawing Sheets

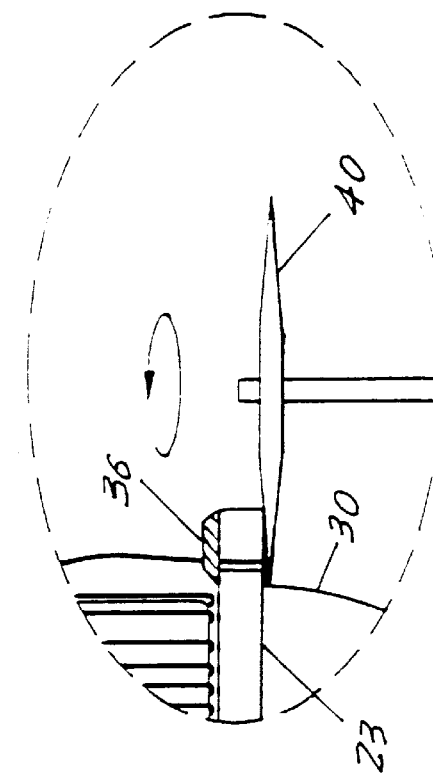
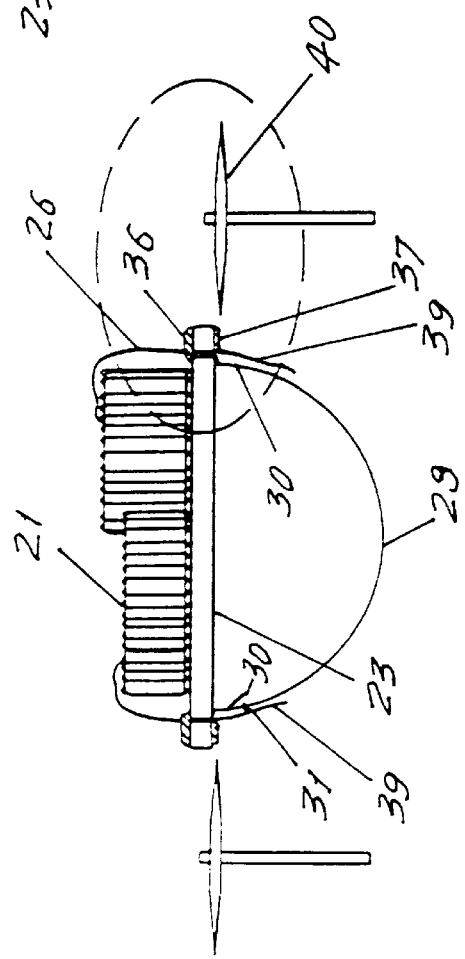
FIG. 3
FIG. 4

METHOD FOR ATTACHING SOLDERABLE WIRE LEADS TO A LEAD FRAME

This application claims the benefit of U.S. Provisional Application No. 60/073,059 filed Jan. 29, 1998.

BACKGROUND OF THE INVENTION

The present invention relates to a method of attaching solderable wires from individual electronic components mounted on a PC board to a lead frame and particularly relates to a novel method of soldering the wires. The present invention also relates to a PC board supported on a fixture for facilitating the soldering.

Electronic components such as ferrite toroids are mounted on a PC board. Each component has a lead wire, e.g., a magnet wire (another name for insulated copper wire) wound on the ferrite toroid.

Traditionally, solderable wires, e.g., magnet wires, extend to respective pins on the electronic component PC board and are hand wrapped around the pins and then hand soldered in place with a soldering iron. The hand wrapping of wires and hand soldering presents numerous problems, including inconsistencies of manufacture. For example, wrapping magnet wire by hand around a pin on a board requires pulling the wire for creating tension to insure proper attachment. The tension varies depending on the person wrapping the wire and may vary with each person from time to time. As a practical result, there is inconsistency in the wire wrapping and in the tension of the wrapped wire about the pin.

Other problems sometimes encountered with hand wrapping include the need to pre-tin the magnet wire in order to remove varnish insulation from the surface of the magnet wire prior to hand wrapping the wire on a pin. Further, hand wrapping and hand soldering are laborious and time consuming, requiring individual attention to each pin.

Hand soldering produces numerous other problems such as the potential damage to the copper core of the magnet wire. Direct contact of the soldering iron with a magnet wire creates further risk of damage. Moreover, hand soldering is subject to inefficiencies as well as inconsistencies due to the duration of contact with the soldering iron and the variability of temperature of the solder iron inherent in a hand soldering process.

Using hand soldering, it is difficult to monitor the process to achieve uniformity, quality and reliability, because hand soldering is operator dependent. Thus, variations occur from operator to operator and even in work performed over a period of time by a single operator.

SUMMARY OF THE INVENTION

Accordingly, this invention concerns a process which eliminates both hand wrapping and hand soldering of electronic component magnet wires, with their inefficiencies and problems. Electronic components on a PC board have magnet wires which are held in place on an edge of the PC board using a wire holding fixture. Then at least the edge of the PC board mounted on the fixture is dipped into a pool of melted solder so that all of the wires are contacted with the solder which fixes the wires to the board, making individual wire winding on pins unnecessary. Each wire is directed from its component downwards through a pathway at the edge of the PC board, preferably a half-moon shaped and internally plated groove. All of the wires are held on their pathways, e.g., in their grooves, by the temporary fixture beneath the PC board, preferably by double-sided adhesive tape or similar means at the fixture.

At least one side of the PC board with the wires held in their pathways is dipped into a solder pool. The solder secures the wires in the pathways, e.g., in the plated grooves, of the board and electrically connects the wires. Then the excess length of the wires extending below the bottom of the PC board is cut with the knife, which may also serve to remove or flatten the solder beneath the edge of the PC board. The fixture has completed its function and is removed from the PC board.

The PC board is installed in a resilient material lead frame shaped to include leads that are resiliently urged against the solder filled wire grooves or pathways on the PC board. The leads of the lead frame are aligned with the grooves of the PC board to enable subsequent electrical connection. Thereafter, the combined PC board and lead frame are dipped in a solder pool such that the solder again flows to the grooves in the board, this time forming an electrical and mechanical connection between the lead frame leads and the wires in their grooves. The electrical connection may result from fusion between the initially applied solder and the presently applied solder. The resulting soldered products have enhanced reliability and uniform quality. Several PC boards may be assembled and mounted on a fixture so as to facilitate simultaneous processing and soldering of several boards.

OBJECTS OF THE INVENTION

The primary object of this invention is to reduce hand performed steps to connect wires, particularly magnet wires, from electronic components on a PC board to a lead frame.

Another objective is to eliminate uneven or unnecessary tension in wires from electronic components on a PC board which tension may be introduced during conventional hand-wrapping of wires around pins on the board.

Another object is to eliminate hand soldering and also soldering of individual wires. Hand-soldering is traditionally done with a soldering iron and solder wire, one pin at a time. This can potentially damage the copper core of the magnet wire. The invention seeks to avoid this. Furthermore, a lead wire is pre-tinned to remove the varnish insulation off the wire, prior to wrapping the wire around the pin. The invention eliminates this. In addition, an object of the invention is to seek to save time used for individual hand-soldering of the wire to the pins and to make the soldering process more efficient and economical. Another object is to eliminate the temperature variability of the soldering iron which is inherent in the hand-soldering process.

Other objects, features and advantages of the present invention will become apparent from the following description of the invention which refers to the accompanying drawings.

BRIEF DESCRIPTION OF THE DRAWINGS

FIG. 3 shows the excess wire removal stage;

FIG. 4 shows the conclusion of the wire removal stage;

DESCRIPTION OF A PREFERRED EMBODIMENT

Figure 1:
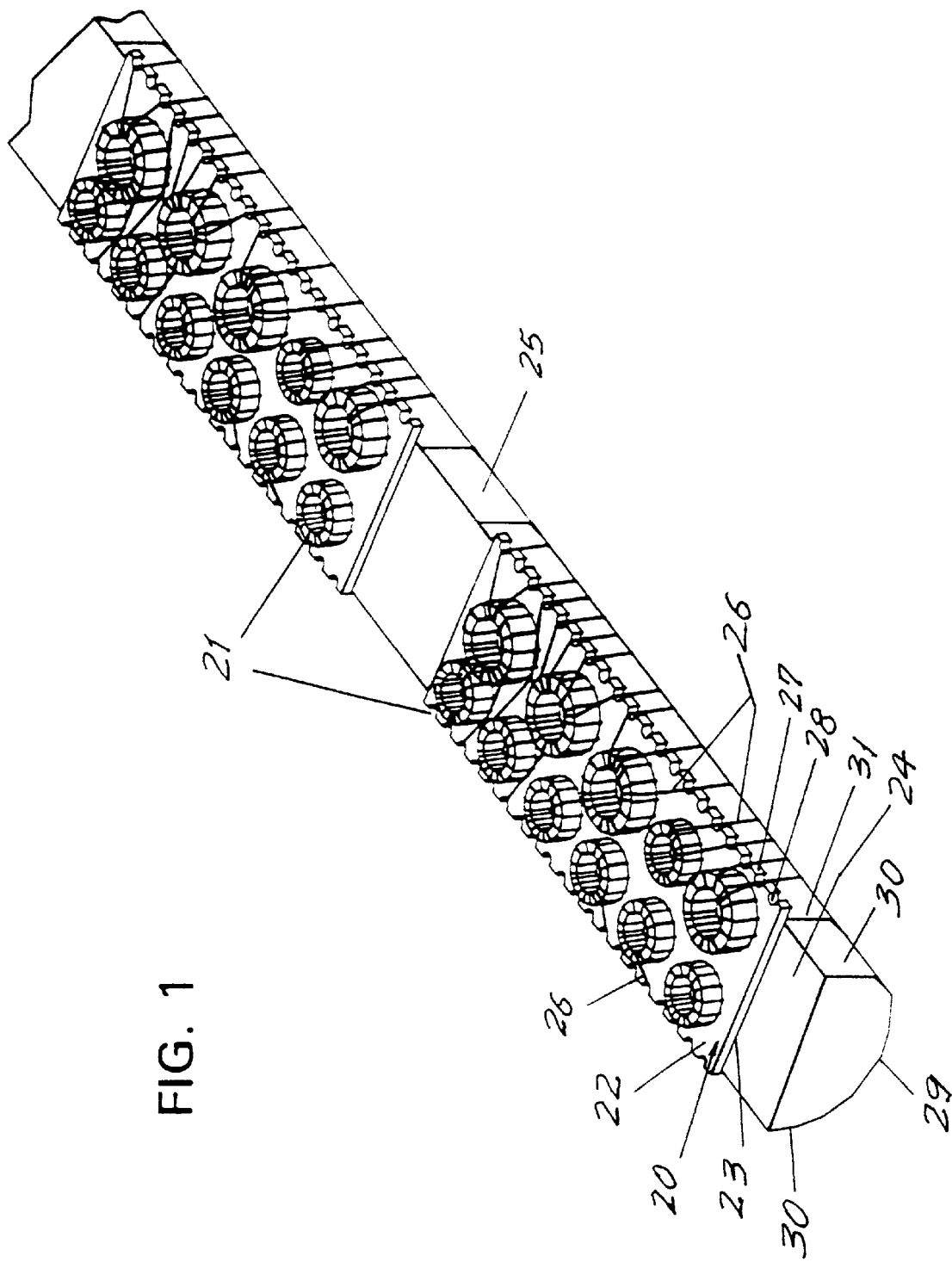
FIG. 1 is a perspective view of an assembly of printed circuit boards mounted on a fixture illustrating some of the elements of and steps in the invention.
Figure 8:
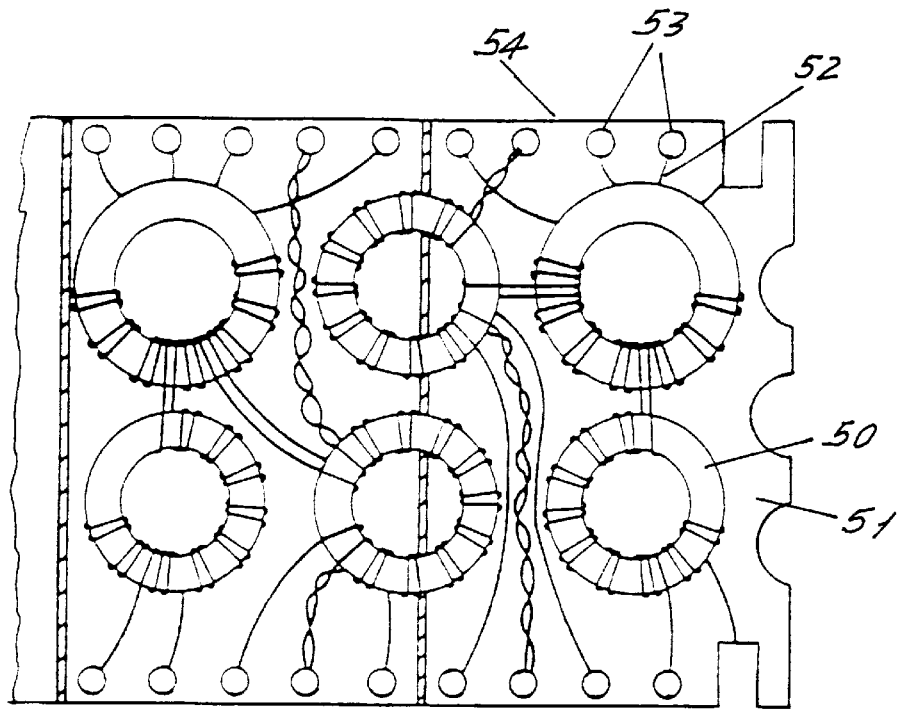
FIG. 8 is a top view of part of a prior art printed circuit board showing component lead wires wrapped and/or soldered to respective pins.

Referring to the drawings, FIG. 1 shows an assembly according to the invention used to perform the method of the invention. A flat PC board 20 of insulating material has a plurality of electronic components, here illustrated as ferrite toroids 21, mounted on the top surface 22 of the PC board 20. The bottom side 23 of the PC board 20 rests on the top surface 24 of a temporary support fixture 25, detailed below. Lead wires and particularly magnet wires 26, are conventionally wound around the toroids 20 and are led to the side edges 27 of the PC board, about where a receiving pin for each wire might be found in the prior art (FIG. 8). Instead, the side edges 27 of the board are provided with respective pathways, in the form of grooves 28 which are half circle shape and preferably metal plated. The wires 26 are led down through their respective grooves.

A temporary support fixture 25 of a material which will not interfere with the solder application step is disposed below the PC board 20, 23. The fixture is generally semi-circular in transverse cross section, i.e., at least it has a rounded bottom side 29. The fixture 25 is narrowed between its lateral sides 30 by slightly greater than the depth of the grooves 28 along both edges 27 of the PC board 20 which permits the wires 26 to extend straight down through their grooves 28 past the edges 27 of the PC board 20.

Some means are provided to hold the wires 26 in their grooves 27 until they are later soldered in place. The fixture 25 has a wire holder for that purpose. For example, strips 31 of double sided adhesive tape are applied to both sides 30 of the fixture to hold the wires 26 extending through their grooves 28 under tension.

Figure 2:
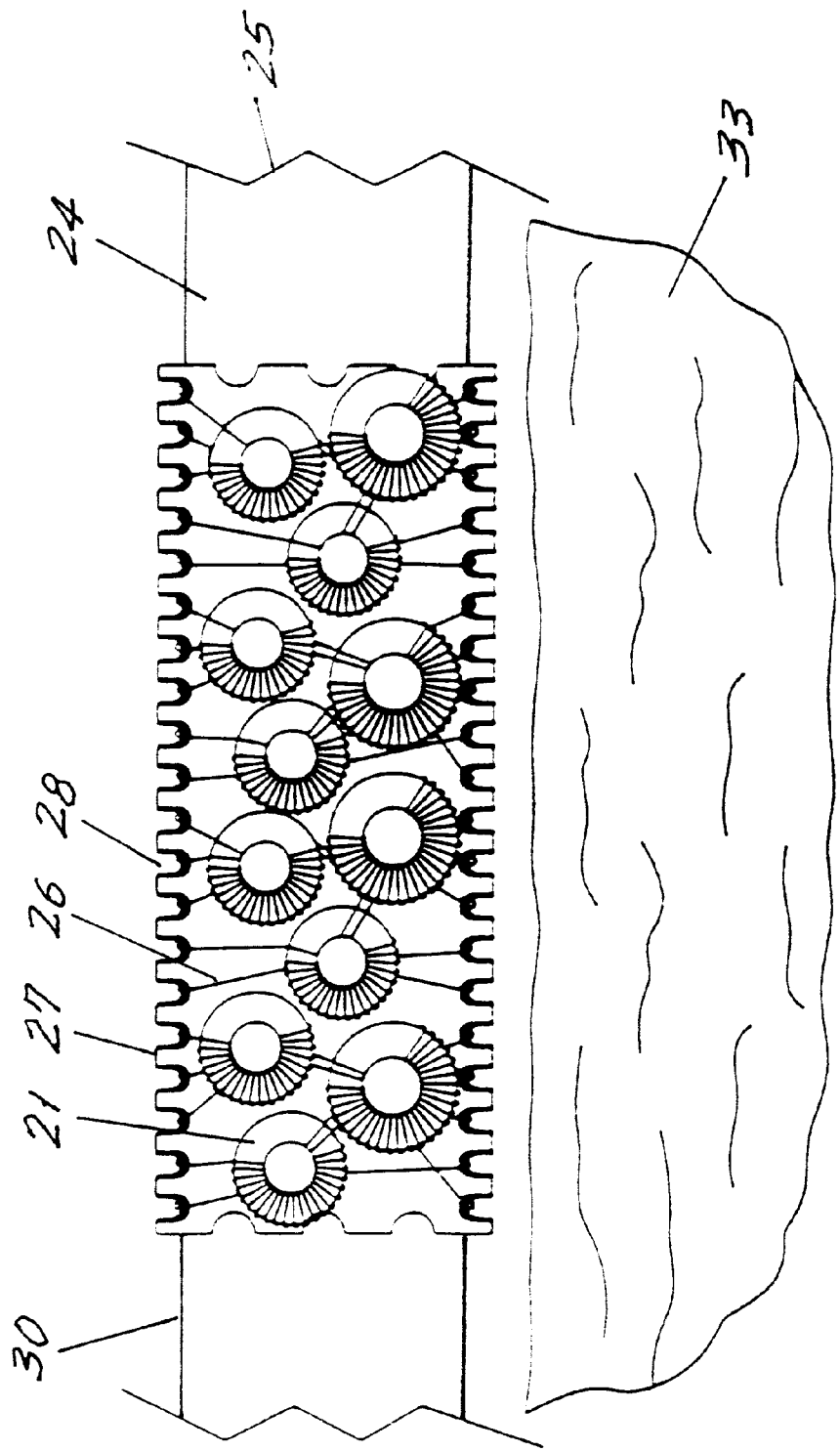
FIG. 2 shows the solder dipping stage.

The bottom 29 of the fixture 25 is rounded which enables rocking the PC board and fixture combination for dipping one or each edge of the PC board into a pool of melted solder 33. FIG. 2 shows the board 20 and fixture 25 rotated to one side just prior to immersion in solder 33. After dipping, the solder at each groove mechanically secures each wire 26 in its groove 28 and also electrically connects to the wire. Now, the tape 31 is no longer needed to hold the wires.

FIG. 3 shows a solder plug 36 above and 37 below the edge region of the board 20 at the grooves 28. Tails or excess wire lengths 39 from the grooves 28 extending below the bottom 23 of the board 20 may be cut by a knife, e.g. a spinning blade 40, as shown in FIGS. 3 and 4. The blade 40 cuts the excess wires 39 just at their exit from the grooves 28. At the conclusion of the cutting, as shown in FIG. 4, cutting blades 40 are underneath and adjacent the PC board surface 23 inward just beyond the grooves 28 toward the fixture side 30. Thus, the blade 40 may also serve to remove or flatten the solder plug 37 along the bottom 23 of the PC board. The solder plug 36 remains above the edge of the board.

As the tape 31 is no longer needed to hold the wire and as the fixture 25 has performed its function, it is removed from the board 20.

Figure 5:
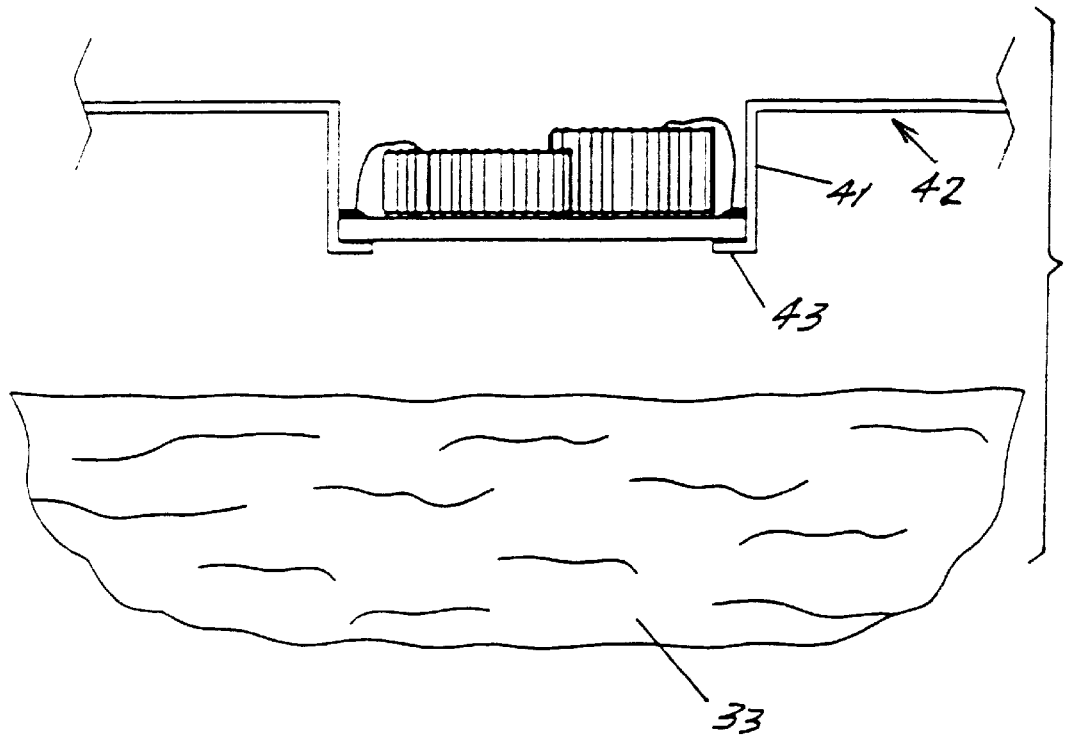
FIG. 5 shows a PC board installed in a lead frame preceding the second solder dipping.

Now, as shown in FIG. 5, the board is installed between the spring resilient, opposing sides 41 of a "Z" shaped lead frame 42. The Z-shape and resilient material of the lead frame 42 provide an inward spring loaded bias that causes the lead frame to sit tightly against the solder filled grooves 28 of the PC board 20. The PC board 20 is pushed down into the lead frame until the bottom edges 23 of the board and the ends of the wires 26 and the solder in the grooves 28 rests on the short legs 43 of the frame 42. The pathways or grooves 26 are aligned with respective leads at the lead frame legs 41, 43. This facilitates electrical connection between individual leads of the lead frame and each of the wires 26.

Figure 6:
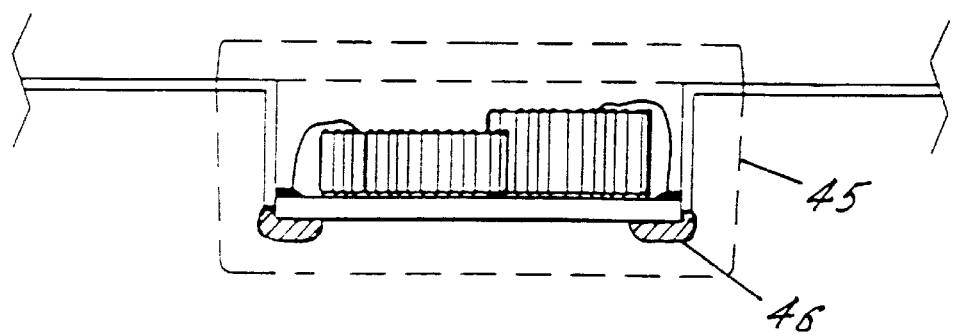
FIG. 6 shows an encased completed assembly.

To complete the mechanical and electrical connection, the PC board 20 on the lead frame 29 are together partly immersed in the solder pool 33 to a level preferably at about one-half the thickness of the PC board 20. Solder from this immersion fillets inside the grooves 28 so as to produce an electrical connection with the wires 26 from the toroids 21, resulting from fusion of the two applications of solder. The resulting solder joint at 46 is seen in FIG. 6. Thereafter, the soldered PC board 21 may be ovenmolded in a plastics or resin package 45, as shown in FIG. 6, in dotted lines.

Figure 7:
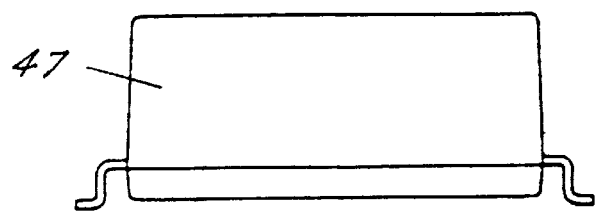
FIG. 7 is an external view of a completed component.

FIG. 7 shows the exterior of a package 47 assembled by the process, with leads from the lead frame extending out.

Figure 9:
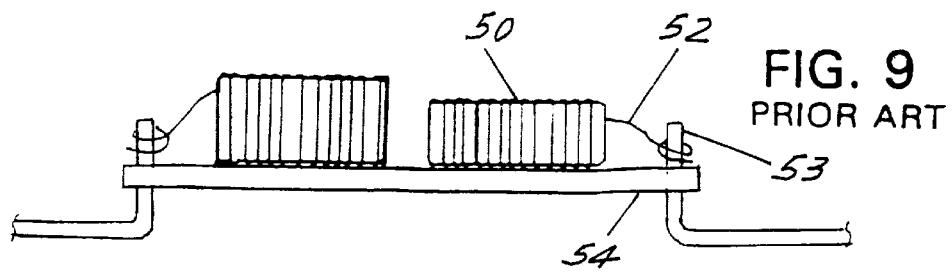
FIG. 9 is a side view thereof.

FIGS. 8 and 9 show prior art over which the invention is an improvement. Ferrite toroid electronic components 50 sit on top of a printed circuit board 51. Magnet wires 52 wrapped around the respective ferrite toroids 50 extend to the respective pins 53 arranged in rows along the edges 54 of the printed circuit board. The wires 52 are wrapped around pins 53. They are usually then hand-soldered. The potential damage to the wires and the lack of uniformity because of the variations in individual operator hand-wrapping and hand-soldering is further apparent from FIG. 9.

Although the present invention has been described in relation to a particular embodiment thereof, many other variations and modifications and other uses will become apparent to those skilled in the art. It is preferred, therefore, that the present invention be limited not by the specific disclosure herein, but only by the appended claims.

What is claimed is:

1. A method for attaching wires from a PC board to a lead frame comprising the steps of:
    (a) providing a plurality of electronic components on top of a PC board and each component having a solderable wire therefrom;
    (b) leading each wire downward to below the PC board through a respective pathway at least one side of the PC board;
    (c) holding each wire within its pathway of the PC board;
    (d) dipping one side of the PC board into solder for soldering the wires in the pathways of the board;
    (e) seating the soldered PC board on a lead frame; and
    (f) immersing the lead frame, with the seated PC board, in solder to form connections between the lead frame and the wires in their pathways.

2. The method of claim 1, further comprising removing excess wire extending from below the PC board following the step of dipping a side of the PC board into solder.

3. The method of claim 2, wherein the step of removing excess wire comprises cutting the wire.

4. The method of claim 3, further comprising flattening the solder below the PC board where the wire is cut.

5. The method of claim 1, further comprising placing a fixture below the PC board and (c) the holding of each wire in its respective pathway comprises securing the wire to the fixture.

6. The method of claim 5, wherein the securing of the wires to the fixture comprises adhering the wires to the fixture.

7. The method of claim 1, wherein the wire pathways are grooves in the sides of the PC board.

8. The method of claim 1, wherein (b) the wires are led down both opposite sides of the PC board and (d) each side of the PC board is dipped in solder.

9. The method of claim 1, wherein (f) immersing the lead frame, with the seated PC board comprises controlling the level of immersion in solder to about one-half the thickness of the PC board.

10. The method of claim 1, further comprising aligning the pathways in the PC board with the leads of the lead frame.

11. The method of claim 5, further comprising the steps of: mounting multiple PC boards in an assembly; and performing the steps on all the assemblies.

12. The method of claim 5, further comprising after (d) dipping the side of the PC board into solder and soldering the wires in the pathways to the board, removing the fixture and thereafter (e) seating the PC board on a lead frame.

\* \* \* \* \*